United States Patent [19]

Stahlhofen et al.

[11] 4,266,000
[45] May 5, 1981

[54] PHOTOSENSITIVE COPYING COMPOSITION

[75] Inventors: Paul Stahlhofen, Wiesbaden; Fritz Erdmann, Mainz, both of Fed. Rep. of Germany

[73] Assignee: Hoechst Aktiengesellschaft, Fed. Rep. of Germany

[21] Appl. No.: 943,193

[22] Filed: Sep. 18, 1978

[30] Foreign Application Priority Data

Sep. 22, 1977 [DE] Fed. Rep. of Germany ....... 2742631

[51] Int. Cl.³ .................. C07C 113/02; G03C 1/52
[52] U.S. Cl. .................. 430/192; 430/193; 260/141
[58] Field of Search ............ 96/91 D, 115 R; 260/141 D; 430/192, 193

[56] References Cited

U.S. PATENT DOCUMENTS

| | | | |
|---|---|---|---|
| 3,046,119 | 7/1962 | Süs | 260/141 D |
| 3,046,121 | 7/1962 | Schmidt | 260/141 D |
| 3,106,465 | 10/1963 | Neugebauer et al. | 260/141 D |
| 3,130,047 | 4/1964 | Uhlig et al. | 260/141 D |
| 3,188,210 | 6/1965 | Fritz et al. | 96/91 D |
| 3,640,992 | 2/1972 | Süs et al. | 260/141 D |

*Primary Examiner*—Won H. Louie, Jr.
*Attorney, Agent, or Firm*—James E. Bryan

[57] ABSTRACT

This invention relates to a photosensitive copying composition comprising a solvent and a naphthoquinone-(1,2)-diazidesulfonic acid ester as the photosensitive compound, said naphthoquinone diazide sulfonic acid ester having the general formula I

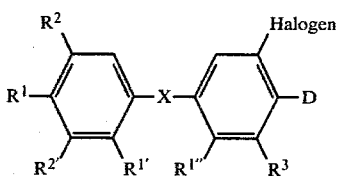

wherein:
X is a single bond or one of the groups $$-CO-, -CH_2-, -S-, -SO_2-, \text{ or}$$

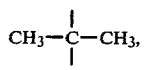

$R^1$, $R^{1'}$ and $R^{1''}$ are the same or different and are H or D,
$R^2$ and $R^{2'}$ are the same or different and are H or halogen,
$R^3$ is halogen or D, and
D is a naphthoquinone-(1,2)-diazidesulfonyloxy group.

9 Claims, No Drawings

PHOTOSENSITIVE COPYING COMPOSITION

This invention relates to a positive-working photosensitive copying composition which is particularly intended for the manufacture of planographic printing plates and photoresists. The copying composition is, in the form of a photosensitive copying layer, applied to a suitable layer support either by the manufacturer or by the user. Generally, metal layer supports, preferably of aluminum, are used.

Positive-working copying compositions employed in practice are, in the first place, compositions which contain o-quinone diazides, especially naphthoquinone-(1,2)-diazide-(2)-sulfonic acid esters as the photosensitive compounds.

Photosensitive materials for the manufacture of positive-working planographic printing plates have been described in numerous publications, for example, in German Pat. Nos. 938,233; 1,124,817; 1,109,521; and 1,120,273, in German Offenlegungsschrift No. 1,904,764, and U.S. Pat. No. 3,802,885. Photosensitive esters of o-naphthoquinone diazide sulfonic acids containing phenols substituted by halogen atoms are known from German Pat. Nos. 938,233; 1,422,474; 1,118,606; and 1,109,521, and from German Offenlegungsschrift No. 2,224,843.

The halogenated photosensitive o-naphthoquinone diazide sulfonic acid esters are exclusively compounds which still contain free unsubstituted phenolic groups. The resistance of such layers to commercial aqueous alkaline developers is usually inadequate for practical purposes. Accordingly, these known halogenated naphthoquinone diazide sulfonic acid esters are suitable only for the preparation of photosensitive copying layers which do not have to meet high standards of quality. The relatively small number of printed copies obtained with them, their comparatively limited photosensitivity, their relatively poor adhesion to the support or their inadequate resistance to developers, render them insufficient for today's practical requirements.

It is, therefore, an object of the present invention to provide a positive-working photosensitive copying material which yields a printing stencil that does not have the disadvantages mentioned.

The invention provides a photosensitive copying composition containing a naphthoquinone-(1,2)-diazide sulfonic acid ester as the photosensitive compound having the general formula I:

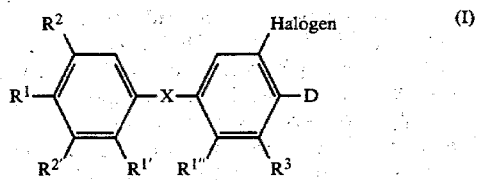

wherein:
X is a single bond or one of the groups

—CO—, —CH$_2$—, —S—, —SO$_2$—, or

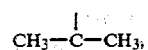

$R^1$, $R^{1'}$ and $R^{1''}$ are the same or different and are H or D, $R^2$ and $R^{2'}$ are the same or different and are H or halogen, $R^3$ is halogen or D, and D is a naphthoquinone-(1,2)-diazide sulfonyloxy group.

The halogenated o-quinone diazides used in the copying composition according to the invention are novel compounds. They are prepared, by analogy to known methods, by esterification of the corresponding halogenated phenol derivatives with o-quinnone diazide sulfonic acids or their derivatives which are capable of reacting, for example, the chlorides of sulfonic acid. The halogen atoms are introduced into the aromatic nuclei of the phenol components in known manner. Bromination, for example, is most advantageously carried out in glacial acetic acid at room temperature. For this purpose, the corresponding starting product is dissolved in glacial acetic acid, and a calculated amount of bromine is added dropwise at room temperature while stirring and, if appropriate, cooling. Generally, the precipitation of the halogenated product will already commence when the addition of bromine is terminated.

The naphthoquinone-(1,2)-diazide sulfonic acid esters are prepared by dissolving the halogenated phenol component together with the corresponding molar quantity of naphthoquinone-(1,2)-diazide-(2)-5-sulfonic acid chloride in dioxane. While stirring at room temperature, a 10 percent by weight soda solution or saturated sodium bicarbonate solution is slowly added to this solution, in each case until a neutral reaction is obtained. Normally, the condensation is terminated after a few hours. Precipitation of the condensation product is followed by drawing off, washing the ester with water until it is free from acid and drying. If the naphthoquinone diazide sulfonic acid ester is not precipitated from the reaction solution, the solution is mixed with ice water while stirring thoroughly, and the precipitated ester is then processed in the usual way.

Suitable halogens are F, Cl, Br and I, with Cl and Br being preferred because they are more readily available and easier to handle. As can be seen from the general formula I, the halogen atoms can adopt only particular positions within the nucleus. Compounds in which all halogen atoms are in the ortho-position with respect to a naphthoquinone diazide sulfonyloxy group are preferred. The advantageous effect produced by the introduction of halogen atoms is generally intensified with an increasing number of halogen atoms in the molecule. As a consequence, compounds containing at least 2 halogen atoms in their molecule are preferred. Compounds containing more than 4 halogen atoms, however, may already tend to a reduced solubility and are, therefore, not normally employed.

Similarly, the number of naphthoquinone diazide sulfonyloxy groups in the molecule is preferably greater than 1. In most cases, compounds containing from two to four of these groups are preferred. The sulfonic acid group is generally in the 4 or 5-position of the naphthoquinone-(1,2)-diazide-(2). The 5-sulfonic acid esters are preferred.

The following compounds may, e.g., be used:

2,4,2',4'-tetrahydroxy-3,5,3',5'-tetrabromo-diphenyl-tetra-[naphthoquinone-(1,2)-diazide-(2)-5-sulfonic acid ester], 2,4-dihydroxy-3,5-dibromo-benzophenone-bis[naphthoquinone-(1,2)-diazide-(2)-5-sulfonic acid ester], 4,4'-dihydroxy-3,5,3',5'-tetrabromo-diphenylmethane-bis-[naphthoquinone-(1,2)-diazide-(2)-5-sulfonic acid ester], 2,6-dibromo-4-(α,α-dimethyl-benzyl)-phenyl-naphthoquinone-(1,2)-diazide-(2)-5-sulfonic acid ester, 2,3,4-trihydroxy-5-bromo-benzophenone-tris[naphthoquinone-(1,2)-diazide-(2)-5-sulfonic acid ester], 2,4-dihydroxy-3,5-dichloro-benzophenone-bis[naphthoquinone-(1,2)-diazide-(2)-5-sulfonic acid ester], 2,4,2',4'-tetrahydroxy-3,5,3',5'-tetrabromo-diphenyl-sulfide-tetra[naphthoquinone-(1,2)-diazide-(2)-5-sulfonic acid ester], and 2,4,2',4'-tetrahydroxy-3,5,3', 5'-tetrabromo-diphenyl-sulfonetetra[naphthoquinone-(1,2)diazide-(2)-5-sulfonic acid ester].

The concentration of the halogenated quinone diazide derivatives in the solid photosensitive layer may vary within comparatively wide limits. Usually, they are present in a proportion of about 3 to 50% by weight, preferably from 7 to 25%, relative to the weight of the solids content of the copying layer. If appropriate, part of the halogenated quinone diazide may be substituted by a corresponding amount of a known halogen-free quinone diazide, preferably, however, the constituent amount of the halogenated compound should prevail.

When preparing the copying layers, the copying composition in the form of a solution in organic solvents, for example, in glycol monomethyl ether, dioxane or aliphatic ketones, is applied to metal foils or plates, for example, aluminum, zinc, copper or multimetal supports, or to paper, plastic film or glass. Aluminum, particularly anodically oxidized aluminum, is preferred as a support material. In addition to the photosensitive quinone diazides the copying layers may contain binders which are insoluble in water, and are soluble or at least swellable in aqueous alkaline solutions. Normally, these additional constituents will improve the uniformity of the film-like coating on the support, enhance the adhesion of the printing stencil and increase the number of copies obtained therewith. Suitable binders which are soluble or swellable in alkaline solutions are natural resins, for example, shellac and colophony, and synthetic resins, for example, copolymers of styrene and maleic anhydride, vinyl polymers containing carbonyl groups, acrylic acid copolymers, polyvinyl acetals and particularly lower molecular weight phenol-formaldehyde condensation resins, preferably novolaks. As is known, the copying layers additionally may contain dyes, plasticizers, adhesion promoters and other additives and auxiliary substances normally used in photosensitive layers.

The coating is applied to the support material in known manner, by means of rollers, vats or spray devices.

After exposure to light, the planographic printing plate is developed using a weakly alkaline solution, whereby the layer areas struck by light are removed while the unexposed image areas remain on the layer support.

The printing form thus prepared will yield high press runs if the preferred halogenated quinone diazides are employed.

In addition, the printing plates produced using the novel compounds exhibit a high practical photosensitivity and an improved resistance to alkaline developers. Further, a relatively steep gradation is obtained with these printing plates, which is desirable in printing practice, because it yields advantages in copying technique.

The compounds preferred according to the invention show an excellent solubility in the customary organic solvents and a good compatibility with the components of the copying layer.

In the examples which follow the relationship between parts by volume (p.b.v.) and parts by weight (p.b.w.) is that of milliliters to grams.

EXAMPLE 1

1.25 p.b.w. of the esterification product of 1 mole of 3,5,3',5'-tetrabromo-2,4,2',4'-tetrahydroxy-diphenyl and 4 moles of naphthoquinone-(1,2)-diazide-(2)-5-sulfonic acid chloride, 6.10 p.b.w. of a cresol-formaldehyde novolak having a softening range of 105° to 120° C., according to DIN 53181, 0.07 p.b.w. of Crystal Violet, 0.05 p.b.w. of 2,3,4-trihydroxy-benzophenone, and 0.14 p.b.w. of naphthoquinone-(1,2)-diazide-(2)-4-sulfonic acid chloride are dissolved in a solvent mixture comprising 35 p.b.v. of ethylene glycol monomethyl ether and 45 p.b.v. of tetrahydrofuran.

An electrolytically roughened and anodized aluminum foil is coated with this solution.

For the preparation of a printing form the printing plate thus obtained is exposed to light under a diapositive and development is carried out in the usual manner using the following solution:

5.3 p.b.w. of sodium metasilicate·9 $H_2O$ 3.4 p.b.w. of trisodium phosphate·12 $H_2O$ 0.3 p.b.w. of sodium dihydrogen phosphate (anhydrous), and 91.0 p.b.w. of water, the exposed layer areas being removed thereby. About 250,000 prints are obtained in an offset printing machine with the printing form thus produced.

If, in the above-specified formula, the brominated o-quinone diazide sulfonic acid ester is substituted by an equal amount of the corresponding non-halogenated o-quinnone diazide sulfonic acid ester and the printing form is, for the rest, prepared in the same way, only 150,000 copies may be printed. It is further remarkable that a poor resistance to the developer and a relatively flat gradation of the printing stencil result from this procedure.

The advantages in copying and printing techniques of the new halogenated o-quinone diazide sulfonic acid esters as compared with the corresponding non-halogenated o-quinone diazide sulfonic acid esters or as compared with the known halogenated quinone diazides are particularly easily observed when the o-quinone diazide sulfonic acid esters are applied to a defined layer support in a relatively thin film (about 1.0 g/m²) without any binder or other additive. A comparative examination with respect to copying and printing techniques shows clearly that by the introduction of at least one halogen atom into a benzene ring carrying an o-naphthoquinone diazide sulfonyloxy group, according to the invention, the number of printed copies obtained is increased, the resistance to aqueous alkaline developers is improved, the gradation becomes steeper, and the photosensitivity is enhanced.

In the following Examples 2 to 10, further coating solutions are specified which yield similar results. If not specifically mentioned, the preparation and processing of the planographic printing plates obtained with these solutions correspond to the conditions described in Example 1.

EXAMPLE 2

1.25 p.b.w. of the esterification product of 1 mole of 2,4-dihydroxy-3,5-dibromo-benzophenone and 2 moles of naphthoquinone-(1,2)-diazide-(2)-5-sulfonic acid chloride,
6.00 p.b.w. of the cresol-formaldehyde novolak specified in Example 1,
0.06 p.b.w. of Crystal Violet, and
0.18 p.b.w. of naphthoquinone-(1,2)-diazide-(2)-4-sulfonic acid chloride
are dissolved in a solvent mixture comprising
40 p.b.v. of ethylene glycol monomethyl ether and
60 p.b.v. of tetrahydrofuran.

An electrolytically roughened and anodized aluminum foil is coated with this solution.

EXAMPLE 3

1.40 p.b.w. of the esterification product of 1 mole of 2,4-dihydroxy-3,5-dibromo-benzophenone and 2 moles of naphthoquinone-(1,2)-diazide-(2)-5-sulfonic acid chloride,
6.20 p.b.w. of the cresol-formaldehyde novolak specified in Example 1,
0.05 p.b.w. of Crystal Violet, and
0.03 p.b.w. of Sudan Yellow GGN (C.I. 11021)
are dissolved in a solvent mixture comprising
35 p.b.v. of ethylene glycol monomethyl ether and
45 p.b.v. of tetrahydrofuran.

An electrolytically roughened and anodized aluminum foil is coated with this solution.

EXAMPLE 4

1.30 p.b.w. of the esterification product of 1 mole of 2,6-dibromo-4-($\alpha,\alpha$-dimethyl-benzyl)-phenol and 1 mole of naphthoquinone-(1,2)-diazide-(2)-5-sulfonic acid chloride,
5.60 p.b.w. of a phenol-formaldehyde novolak containing 14% of phenolic OH groups and having a softening range of 110° to 120° C. according to DIN 53181,
0.04 p.b.w. of Crystal Violet,
0.13 p.b.w. of naphthoquinone-(1,2)-diazide-(2)-4-sulfonic acid chloride,
0.10 p.b.w. of 2,3,4-trihydroxy benzophenone, and
0.60 p.b.w. of phosphoric acid tri-($\alpha$-chlorethyl)-ester
are dissolved in a solvent mixture comprising
40 p.b.v. of tetrahydrofuran and
40 p.b.v. of ethylene glycol monomethyl ether.

An electrolytically roughened and anodized aluminum foil is coated with this solution.

EXAMPLE 5

1.50 p.b.w. of the esterification product of 1 mole of 2,4-dihydroxy-3,5-dibromo-benzophenone and 2 moles of naphthoquinone-(1,2)-diazide-(2)-5-sulfonic acid chloride,
5.20 p.b.w. of the phenol-formaldehyde novolak specified in Example 4,
0.20 p.b.w. of polyvinyl butyral,
0.15 p.b.w. of Crystal Violet,
0.08 p.b.w. of Sudan Yellow GGN (C.I. 11021), and
0.60 p.b.w. of tris-($\beta$-chlorethyl)-phosphate
are dissolved in a solvent mixture comprising
40 p.b.v. of ethylene glycol monomethyl ether, and
50 p.b.v. of tetrahydrofuran.

An aluminum foil roughened by brushing with steel wire brushes is coated with this solution.

EXAMPLE 6

1.20 p.b.w. of the esterification product of 1 mole of 2,4-dihydroxy-3,5-dichloro-benzophenone and 2 moles of naphthoquinone-(1,2)-diazide-(2)-5-sulfonic acid chloride,
6.00 p.b.w. of the phenol-formaldehyde novolak specified in Example 4,
0.07 p.b.w. of Crystal Violet, and
0.14 p.b.w. of naphthoquinone-(1,2)-diazide-(2)-4-sulfonic acid chloride,
are dissolved in a solvent mixture comprising
40 p.b.v. of ethylene glycol monomethyl ether,
50 p.b.v. of tetrahydrofuran, and
10 p.b.v. of butyl acetate.

An electrolytically roughened and anodized aluminum foil is coated with this solution.

EXAMPLE 7

1.45 p.b.w. of the esterification product of 1 mole of 2,4-dihydroxy-3,5-dichloro-benzophenone and 2 moles of naphthoquinone-(1,2)-diazide-(2)-5-sulfonic acid chloride,
4.80 p.b.w. of the phenol-formaldehyde novolak specified in Example 4,
0.20 p.b.w. of polyvinyl butyral,
0.45 p.b.w. of naphthoquinone-(1,2)-diazide-(2)-4-sulfonic acid chloride, and
0.12 p.b.w. of Crystal Violet base
are dissolved in a solvent mixture comprising
30 p.b.v. of ethylene glycol monomethyl ether and
30 p.b.v. of tetrahydrofuran.

The chromium layer of a trimetal plate comprising aluminum/copper/chromium serves as the layer support.

EXAMPLE 8

0.87 p.b.w. of the esterification product of 1 mole of 2,3,4-trihydroxy-5-bromo-benzophenone and 3 moles of naphthoquinone-(1,2)-diazide-(2)-5-sulfonic acid chloride,
0.70 p.b.w. of the esterification product of 1 mole of 2,2'-dihydroxy-dinaphthyl-(1,1')-methane and 2 moles of naphthoquinone-(1,2)-diazide-(2)-5-sulfonic acid chloride,
6.40 p.b.w. of the cresol-formaldehyde novolak specified in Example 1,
0.07 p.b.w. of Crystal Violet base,
0.16 p.b.w. of naphthoquinone-(1,2)-diazide-(2)-4-sulfonic acid chloride, and
0.60 p.b.w. of tris-($\beta$-chlorethyl)-phosphate
are dissolved in a solvent mixture comprising
30 p.b.v. of ethylene glycol monomethyl ether,
40 p.b.v. of tetrahydrofuran, and
10 p.b.v. of butyl acetate.

An electrolytically roughened and anodized aluminum foil is coated with this solution.

EXAMPLE 9

In this Example a copying layer solution is described which can be used as a positive photoresist composition for various purposes, particularly for the preparation of etch resists, for example, for etching shaped articles and signboards and in the production of conductor images, particularly also in microelectronics. The solution has a long shelf-life. It is possible to adapt the type of coating and layer thickness within wide limits to the requirements in each case. After exposure to light the exposed areas are light green and contrast considerably with the unexposed areas which remain intensively blue colored. The exposed areas can be easily removed with an alkaline developer (pH about 12.8).

1.5 p.b.w. of the esterification product of 1 mole of 2,4-dihydroxy-3,5-dibromo-benzophenone and 2 moles of naphthoquinone-(1,2)-diazide-(2)-5-sulfonic acid chloride,
10 p.b.w. of the phenol-formaldehyde novolak specified in Example 4,
2 p.b.w. of an epoxy resin composed of bisphenol A and epichlorohydrin and having an average molecular weight below about 1,000,
0.1 p.b.w. of Crystal Violet, and
0.3 p.b.w. of naphthoquinone-(1,2)diazide-(2)-4-sulfonic acid chloride
are dissolved in
75 p.b.v. of ethylene glycol monoethyl ether.

EXAMPLE 10

1.40 p.b.w. of the esterification product of 1 mole of 3,5,3',5'-tetrabromo-4,4'-dihydroxy-diphenylmethane and 2 moles of naphthoquinone-(1,2)-diazide-(2,)-5-sulfonic acid chloride,
5.30 p.b.w. of the cresol-formaldehyde novolak specified in Example 1,
0.08 p.b.w. of Crystal Violet base,
0.08 p.b.w. of 2,3,4-trihydroxy-benzophenone, and
0.14 p.b.w. of naphthoquinone-(1,2)-diazide-(2)-4-sulfonic acid chloride
are dissolved in a solvent mixture comprising
30 p.b.v. of ethylene glycol monomethyl ether,
30 p.b.v. of tetrahydrofuran, and
10 p.b.v. of butyl acetate.
An electrolytically roughened and anodized aluminum foil is coated with this solution.

EXAMPLE 11

1.30 p.b.w. of the esterification product of 1 mole of 2,2-bis-(3,5-dibromo-4-hydroxy-phenyl)-propane and 2 moles of naphthoquinone-(1,2)-diazide-(2)-5-sulfonic acid chloride,
6.00 p.b.w. of the cresol-formaldehyde novolak specified in Example 1,
0.20 p.b.w. of polyvinyl butyral,
0.04 p.b.w. of Crystal Violet,
0.08 p.b.w. of 2,3,4-trihydroxy-benzophenone, and
0.10 p.b.w. of naphthoquinone-(1,2)-diazide-(2)-4-sulfonic acid chloride
are dissolved in a solvent mixture comprising
30 p.b.v. of ethylene glycol monomethyl ether, and
35 p.b.v. of tetrahydrofuran.
An electrolytically roughened and anodized aluminum foil is coated with this solution.

EXAMPLE 12

1.40 p.b.w. of the esterification product of 1 mole of 2,4,2',4'-tetrahydroxy-3,5,3',5'-tetrabromo-diphenylsulfide and 4 moles of naphthoquinone-(1,2)-diazide-(2)-5-sulfonic acid chloride,
5.00 p.b.w. of the cresol-formaldehyde novolak specified in Example 1,
0.40 p.b.w. of the epoxy resin specified in Example 9,
0.06 p.b.w. of Crystal Violet base,
0.05 p.b.w. of Sudan Yellow GGN (C.I. 11,021), and
0.08 p.b.w. of 2,3,4-trihydroxy-benzophenone are dissolved in a solvent mixture comprising
40 p.b.v. of ethylene glycol monomethyl ether, and
50 p.b.v. of tetrahydrofuran.
An electrolytically roughened and anodized aluminum foil is coated with this solution.

It will be obvious to those skilled in the art that many modifications may be made within the scope of the present invention without departing from the spirit thereof, and the invention includes all such modifications.

What is claimed is:

1. A photosensitive copying composition comprising a solvent and a naphthoquinone-(1,2)-diazide-sulfonic acid ester as the photosensitive compound, said naphthoquinone diazide sulfonic acid ester having the general formula I

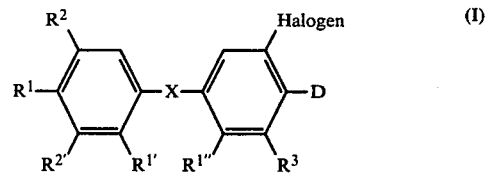

wherein:

X is a single bond or one of the groups

—CO—, —CH$_2$—, —S—, —SO$_2$—, or

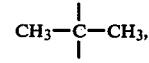

$R^1$, $R^{1'}$, and $R^{1''}$ are the same or different and are H or D, $R^2$ and $R^{2'}$ are the same or different and are H or halogen, $R^3$ is halogen or D, and D is a naphthoquinone-(1,2)-diazide-sulfonyloxy group.

2. A copying composition according to claim 1 in which the compound of the general formula I contains at least two halogen atoms.

3. A copying composition according to claim 1 in which the compound of the general formula I contains from two to four naphthoquinone diazide sulfonyloxy groups.

4. A copying composition according to claim 1 additionally containing in the photosensitive copying layer a resin which is insoluble in water, and is soluble or at least swellable in an aqueous alkaline solution.

5. A copying composition according to claim 4 in which the resin is a phenolic resin.

6. A copying composition according to claim 4 containing from 7 to 25 percent by weight of naphthoquinone diazide sulfonic acid ester, relative to the solids content weight.

7. A compound having the formula

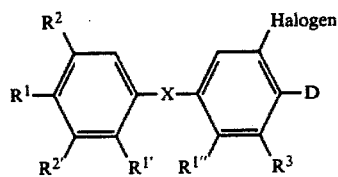

wherein

X is a single bond or one of the groups

—CO—, —CH$_2$—, —S—, —SO$_2$—, or

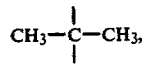

R$^1$, R$^{1'}$ and R$^{1''}$ are the same or different and are H or D,

R$^2$ and R$^{2'}$ are the same or different and are H or halogen,

R$^3$ is halogen or D, and

D is a naphthoquinone-(1,2)-diazide-sulfonyloxy group.

8. A compound according to claim 7 containing at least two halogen atoms.

9. A compound according to claim 7 containing from two to four naphthoquinone diazide sulfonyloxy groups.

* * * * *